(12) United States Patent
Sakoh et al.

(10) Patent No.: US 7,737,481 B2
(45) Date of Patent: Jun. 15, 2010

(54) SEMICONDUCTOR MEMORY DEVICE

(75) Inventors: Takashi Sakoh, Kanagawa (JP); Mami Toda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 155 days.

(21) Appl. No.: 12/031,937

(22) Filed: Feb. 15, 2008

(65) Prior Publication Data

US 2008/0197392 A1    Aug. 21, 2008

(30) Foreign Application Priority Data

Feb. 15, 2007    (JP)    ............................. 2007-035439

(51) Int. Cl.
*H01L 27/108*    (2006.01)
*H01L 29/94*    (2006.01)
(52) U.S. Cl. .............................. 257/300; 257/E27.085; 257/E27.098
(58) Field of Classification Search ................. 257/296, 257/300, E27.085, E27.098
See application file for complete search history.

(56) References Cited

U.S. PATENT DOCUMENTS 5,665,623 A * 9/1997 Liang et al. ................. 438/239
2002/0005590 A1 * 1/2002 Keeth ......................... 257/776
2003/0211673 A1 * 11/2003 Nakamura et al. .......... 438/197
2005/0218440 A1 * 10/2005 Park ........................... 257/298
2007/0268771 A1 * 11/2007 Takemura et al. ...... 365/230.03

FOREIGN PATENT DOCUMENTS

JP    06-005811 A    1/1994

OTHER PUBLICATIONS

S. M. Sze. Semiconductor Devices. Physics and Technology, 2nd Edition, (C) 2002 John Wiley and Sons, p. 398.*

* cited by examiner

*Primary Examiner*—N Drew Richards
*Assistant Examiner*—Sergey Alekseyev
(74) *Attorney, Agent, or Firm*—Young & Thompson

(57) ABSTRACT

A semiconductor memory device has bit lines, capacitors, bit contacts and capacitor contacts, wherein the bit lines are provided over a semiconductor substrate, the bit lines are connected to the semiconductor substrate through the bit contacts, the capacitors are connected to the semiconductor substrate through the capacitor contacts, and wherein in two adjacent bit lines, pitch d2 (first pitch) representing a pitch of portions provided with the capacitor contacts is larger than pitch d3 (second pitch) representing a pitch of portions provided with the bit contacts, and distance d4 between two such bit lines in the portions provided with the bit contacts is larger than width d5 of the bit lines in the portions provided with the bit contacts.

14 Claims, 10 Drawing Sheets

SEMICONDUCTOR MEMORY DEVICE

This application is based on Japanese patent application No. 2007-035439 the content of which is incorporated hereinto by reference.

BACKGROUND

1. Technical Field

The present invention relates to a semiconductor memory device.

2. Related Art

FIG. 7 is a plan view showing a conventional DRAM. FIG. 8 is a sectional view taken along the line VIII-VIII in FIG. 7. A DRAM 100 has bit lines 101, word lines 102, bit contacts 103, capacitor contacts 104 and capacitors 106. Each bit contact 103 connects the bit line 101 and a semiconductor substrate 105.

Each capacitor contact 104 connects the capacitor 106 and the semiconductor substrate 105. In the DRAM 100, two every adjacent bit lines 101 are aligned in parallel while keeping a constant pitch d1 (center-to-center distance).

A preceding technical literature relevant to the present invention may be exemplified by Japanese Laid-Open Patent Publication No. H6-5811.

The present inventors have recognized as follows. In the DRAM 100, the pitch d1 is set as large enough as ensuring a necessary level of margin for alignment between the bit lines 101 and the capacitor contacts 104. More specifically, the pitch d1 is set large enough so as to avoid undesirable contact between the bit lines 101 and capacitor contacts 104, taking process error in the manufacturing into consideration. As a consequence, portions provided with the bit contacts 103 have an unnecessarily large space between the bit lines 101. This may result in lowering in density of arrangement of the bit lines 101, and increase in the chip size.

SUMMARY

According to the present invention, there is provided a semiconductor memory device which includes a plurality of bit lines provided above a semiconductor substrate; capacitors provided in an upper layer of the bit lines; bit contacts connecting the bit lines and the semiconductor substrate; and capacitor contacts connecting the capacitors and the semiconductor substrate, wherein in two adjacent bit lines, a first pitch representing a pitch of portions provided with the capacitor contacts is larger than a second pitch representing a pitch of portions provided with the bit contacts, and distance between two such bit lines in the portions provided with the bit contacts is larger than width of the bit lines in the portions provided with the bit contacts.

In the present invention, the pitch of two every adjacent bit lines is differed between the portions provided with the capacitor contacts and the portions provided with the bit contacts. More specifically, the pitch (first pitch) of the former is set larger than the pitch (second pitch) of the latter. By virtue of the setting, the bit lines may be arranged with higher density, while ensuring a necessary level of margin for alignment of the bit lines and the capacitor contacts.

According to the present invention, a semiconductor memory device, in which the bit lines may be arranged with higher density while ensuring a necessary level of margin for alignment of the bit lines and capacitor contacts, may be realized.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1:
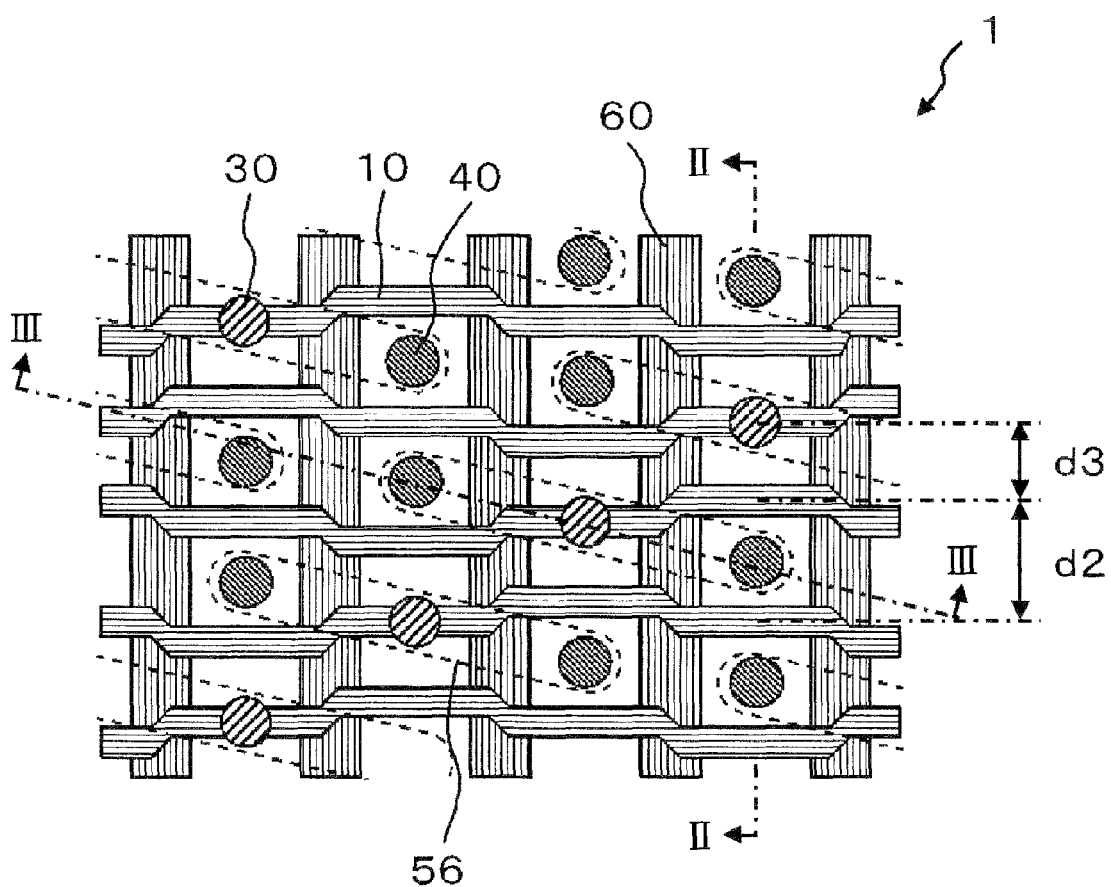
FIG. 1 is a plan view showing a first embodiment of the semiconductor memory device of the present invention.

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

First Embodiment

Paragraphs below will detail preferred embodiments of the present invention, referring to the attached drawings. It is to be understood that, in the explanation of the drawings, any similar constituents will be given with the same reference numerals, and the explanation therefor will not be repeated.

Figure 2:
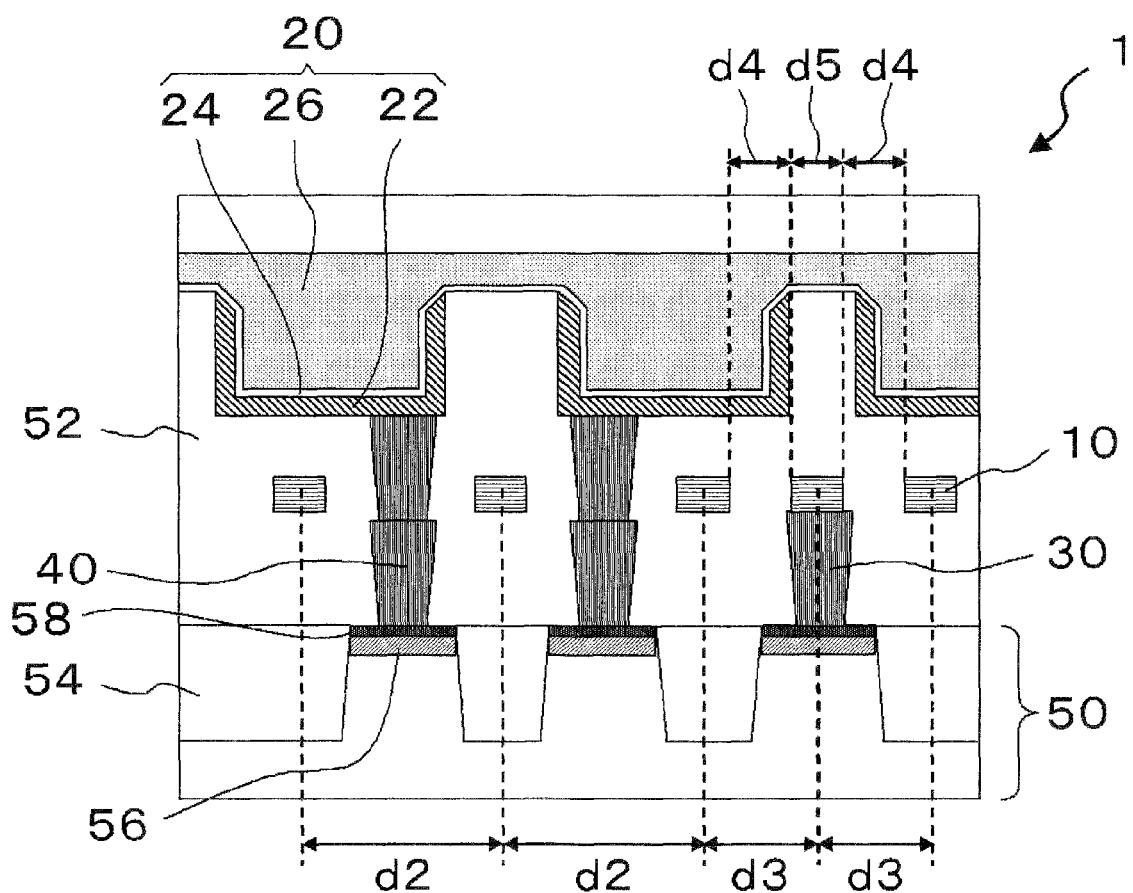
FIG. 2 is a sectional view taken along line II-II in FIG. 1.

FIG. 1 is a plan view showing one embodiment of the semiconductor memory device of the present invention. FIG. 2 is a sectional view taken along line II-II in FIG. 1. A semiconductor memory device 1 has bit lines 10, capacitors 20, bit contacts 30, and capacitor contacts 40. These constituents composes a DRAM.

The bit lines 10 are provided above a semiconductor substrate 50. More specifically, the bit lines 10 are provided in an insulating interlayer 52 formed over the semiconductor substrate 50. In this embodiment, the semiconductor substrate 50 is a silicon substrate. Width of each bit line 10 is set nearly constant. Thickness of each bit line 10 is preferably 30 nm or larger and 90 nm or smaller.

In the insulating interlayer 52, there are also provided the capacitors each composed of a lower electrode 22, a capacitor insulating film 24 and an upper electrode 26. The capacitors 20 are placed on the upper layer of the bit lines 10. That is, the DRAM has the COB (capacitor over bit-line) structure. The upper electrode 26 and the lower electrode 22 of the capacitor 20 is composed of a metal material.

The bit lines 10 are connected to the semiconductor substrate 50 through the bit contacts 30. More specifically, the bit contacts 30 connects the bit lines 10 and diffusion layers 56 (areas surrounded by broken lines in FIG. 1) formed in the semiconductor substrate 50. The surficial portions of the diffusion layers 56 are silicided, and thereby silicide layers 58 are formed. In this embodiment, the entire range of the surficial portions of the diffusion layers 56 in the DRAM is silicided. The adjacent diffusion layers 56 are isolated from each other by a device isolation region 54 typically configured as STI (shallow trench isolation).

The capacitors 20 are connected to the semiconductor substrate 50 through the capacitor contacts 40. More specifically, the capacitor contacts 40 connect the capacitors 20 and the diffusion layers 56. In this embodiment, the capacitor contacts 40 are composed of double-storied electroconductive plugs. A material composing the capacitor contacts 40 preferably contains tungsten.

As for two every adjacent bit lines 10, the pitch d2 (first pitch) of the portions provided with the capacitor contacts 40 is larger than the pitch d3 (second pitch) of the portions provided with the bit contacts 30. The pitch between the bit lines 10 herein is defined as distance between the center lines of the bit lines 10. Accordingly, the pitch d2 of the portions provided with the capacitor contacts 40 equals to length of the line segment which passes the center of the capacitor contact, and connects the center lines of two bit lines disposed on both sides of the capacitor contact 40 with the shortest path. On the other hand, the pitch d3 of the portions provided with the bit contacts 30 equals to length of the line segment which has one end thereof agreed with the center of the bit contact 30, and connects the center lines of the bit line 10 in contact with the bit contact 30 and the adjacent bit line 10 with the shortest path. Assuming the pitch d3 as 1, the pitch d2 is preferably 1.2 or larger and 2 or smaller.

Distance d4 of the bit lines 10 in the portions provided with the bit contacts 30 is larger than width d5 of the bit lines 10 in the portions provided with the bit contacts 30. The distance d4 equals to a line segment, such that the extension of which passes the center of the bit contact 30, among all line segments which connect the bit line 10 in contact with the bit contact 30 and the adjacent bit line 10 with the shortest path. In this embodiment, the distance d4 equals to the minimum distance between the bit lines 10. On the other hand, width d5 represents the width of the bit lines 10 in the portions in contact with the bit contacts 30.

The semiconductor memory device 1 is provided also with word lines 60 as shown in FIG. 1. The surficial portions of the word lines 60 are silicided. In this embodiment, the entire range of the surficial portions of the word lines 60 is silicided. The direction of extension of the word lines 60 (vertical direction in FIG. 1) is now assumed as a first direction, and the direction of extension of the diffusion layers 56 as a second direction. In this case, angle θ between the first and second directions satisfies 0<θ<90°. In other words, the diffusion layers 56 extend in an oblique direction, that is, in a direction in agreement with neither of the direction of extension of the word lines 60 nor the direction normal thereto. The angle θ preferably satisfies 45°≦θ≦80°.

Figure 3:
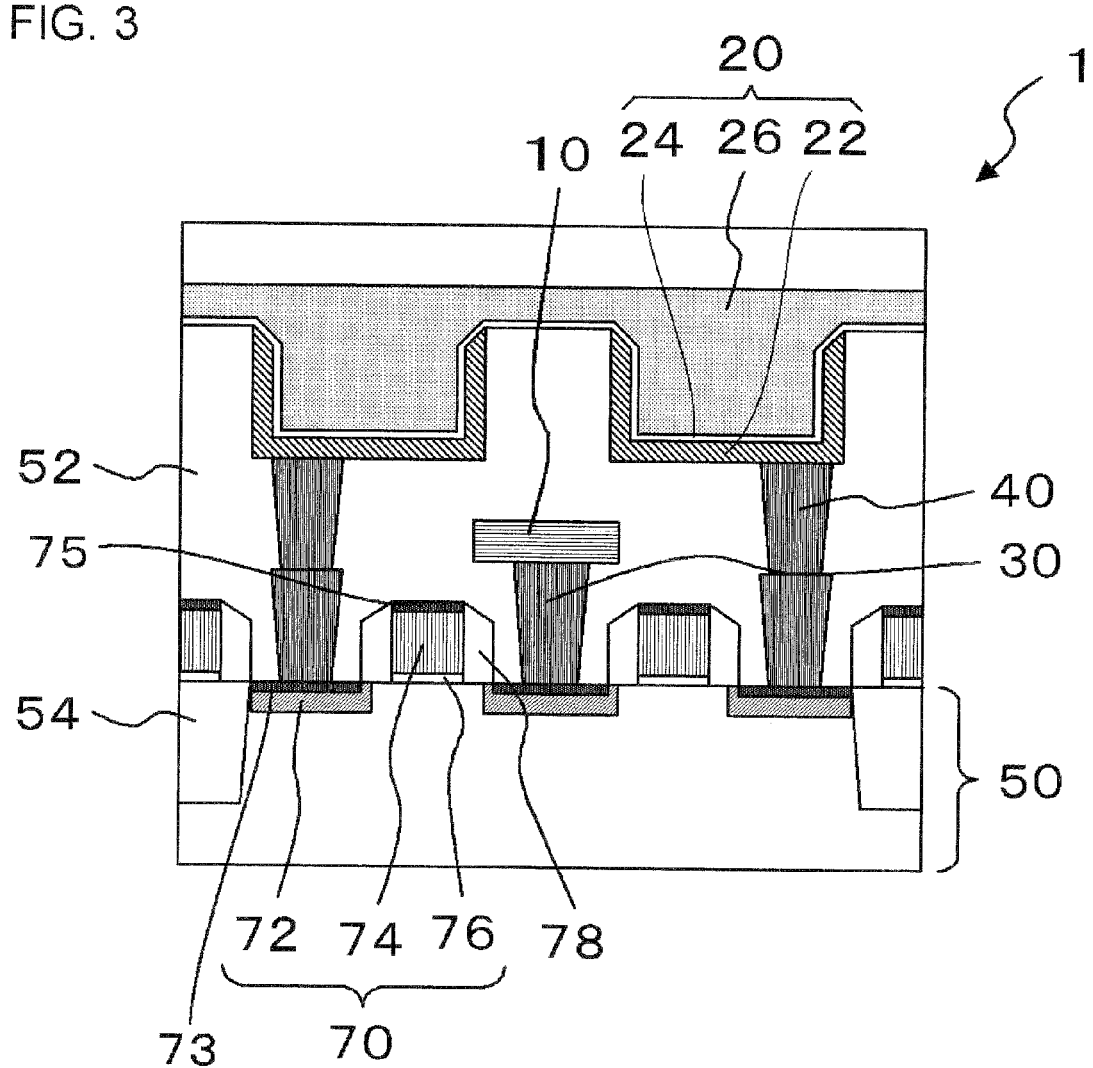
FIG. 3 is a sectional view taken along line III-III in FIG. 1.

FIG. 3 is a sectional view taken along line III-III in FIG. 1. As shown in the drawing, the semiconductor memory device 1 is provided also with field effect transistors (FETs) 70. Each FET 70 has source/drain regions 72 (a part of the diffusion layer 56), a gate electrode 74 (a part of the word line 60), and a gate insulating film 76. Because the surficial portions of the diffusion layers 56 and the word lines 60 are silicided, also the surficial portions of the source/drain regions 72 and the gate electrodes 74 are silicided, and thereby silicide layers 73 and silicide layers 75 are formed. The side faces of the gate electrodes 74 are covered with sidewall insulating films 78.

The FETs 70 are connected to the bit lines 10 through the bit contacts 30, and connected to the capacitors 20 through the capacitor contacts 40. More specifically, the either one of the source/drain regions 72 is connected with the bit line 10, and the other is connected with the capacitor 20.

Figure 4:
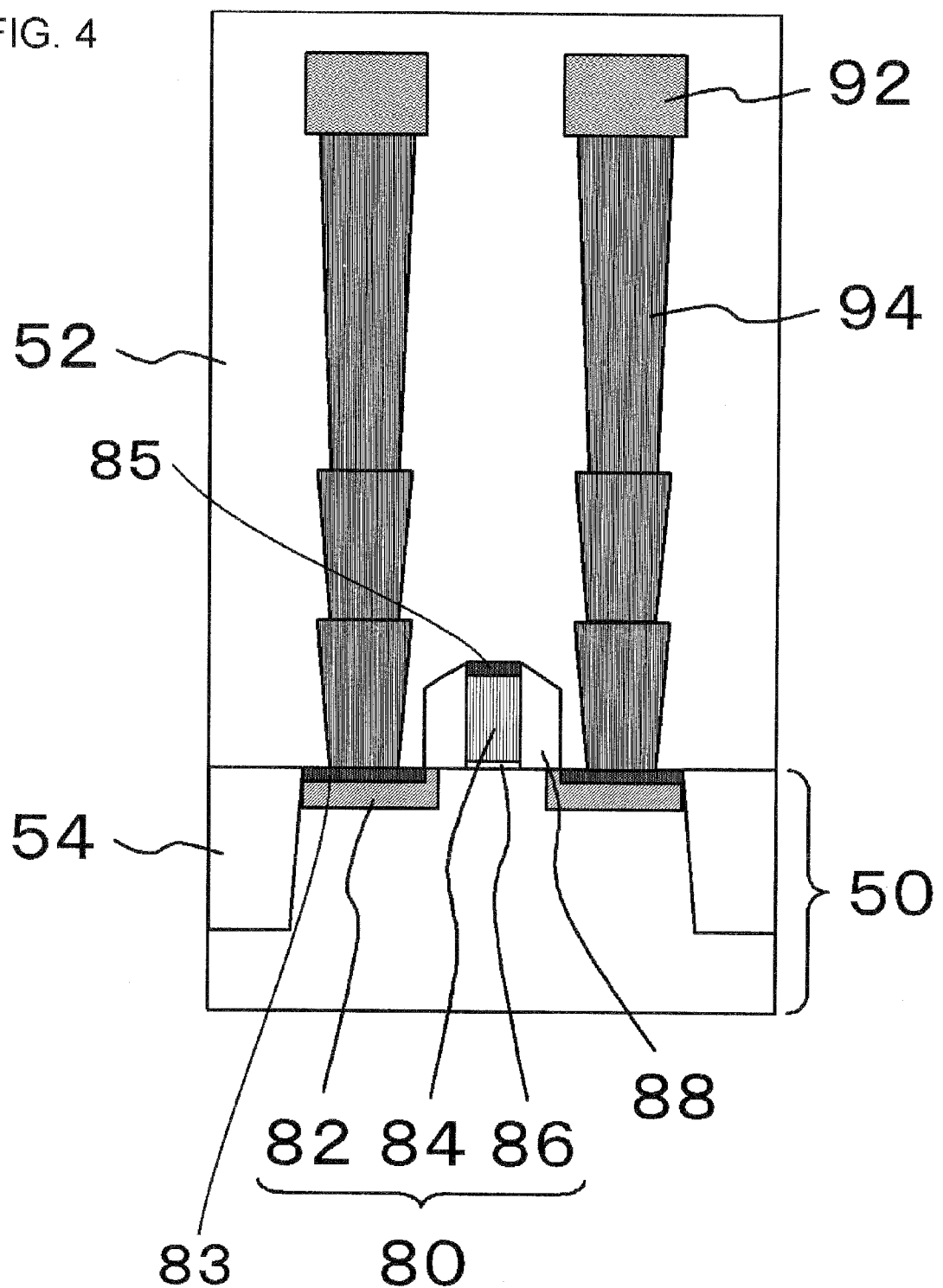
FIG. 4 is a sectional view showing a logic portion of the semiconductor memory device shown in FIG. 1.

FIG. 4 is a sectional view showing the logic portion of the semiconductor memory device 1. As is obvious, the DRAM is an embedded DRAM integrated with logic circuits. As shown in the drawing, the logic portion has FETs 80 formed therein. Each FET 80 has source/drain regions 82, a gate electrode 84 and a gate insulating film 86. The surficial portions of the source/drain regions 82 and the gate electrode 84 are silicided, and thereby a silicide layer 83 and a silicide layer 85 are formed. The side faces of the gate electrode 84 are covered with sidewall insulating films 88. The source/drain regions 82 are connected with interconnects 92 through electroconductive plugs 94. Gate length of the FET 80 is shorter than that of the FET 70 (see FIG. 3). The gate insulating film 86 is thinner than the gate insulating film 76 of the FET 70. Thickness of the gate insulating film 76 and the gate insulating film 86 are typically 5 nm and 2 nm, respectively.

Effects of this embodiment will be explained. In this embodiment, the pitches between two every adjacent bit lines 10 are differed between the portions provided with the capacitor contacts 40 and the portions provided with the bit contacts 30. More specifically, as shown in FIG. 1 and FIG. 2, the former pitch (pitch d2) is set larger than the latter pitch (pitch d3). By virtue of this configuration, the bit lines 10 may be arranged with higher density while ensuring a necessary level of margin for alignment of the bit lines 10 and capacitor contacts 40. This contributes to shrinkage of the chip size.

In addition, the distance d4 between the bit lines 10 in the portions provided with the bit contacts 30 is larger than the width d5 of the bit lines 10 in the portions provided with the bit contacts 30. By virtue of this configuration, parasitic capacitance appears between the bit lines 10 may be reduced, and thereby a DRAM with a sufficiently high operation speed may be realized.

Figure 5:
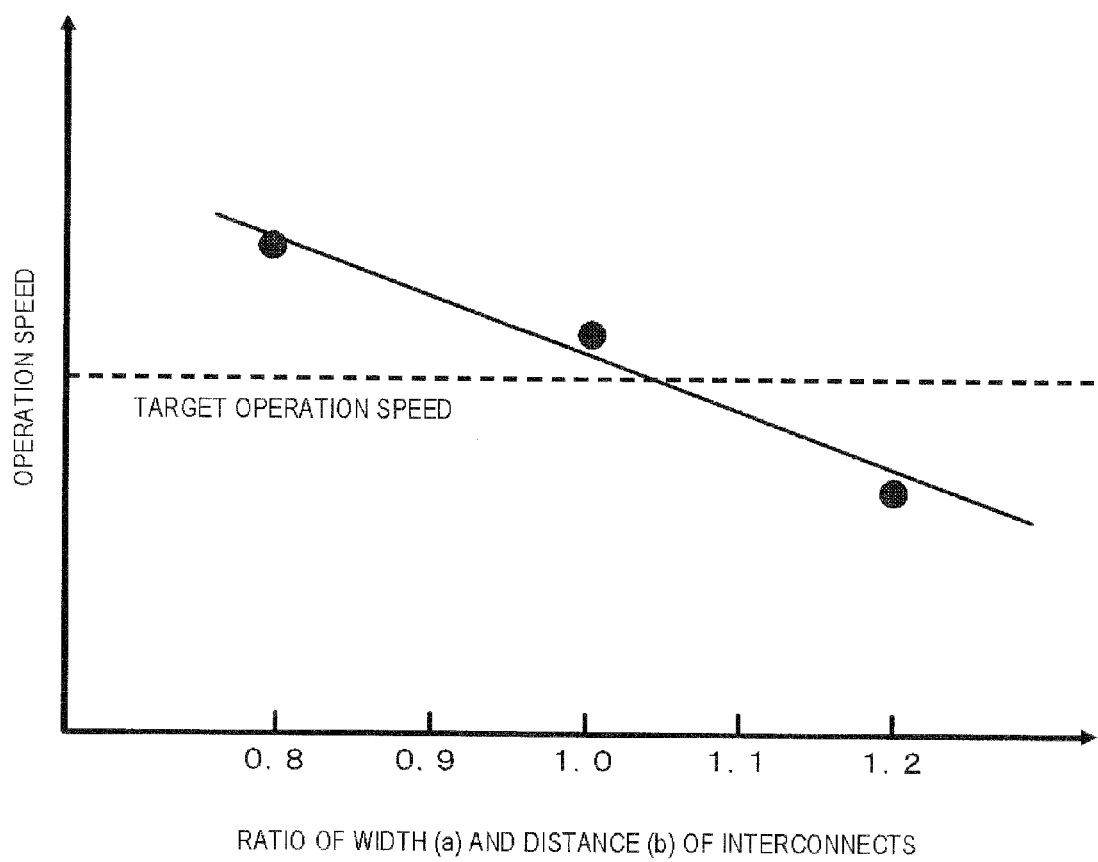
FIG. 5 is a graph showing a relation between operation speed of circuit and ratio of width and pitch of the interconnects.
Figure 6:
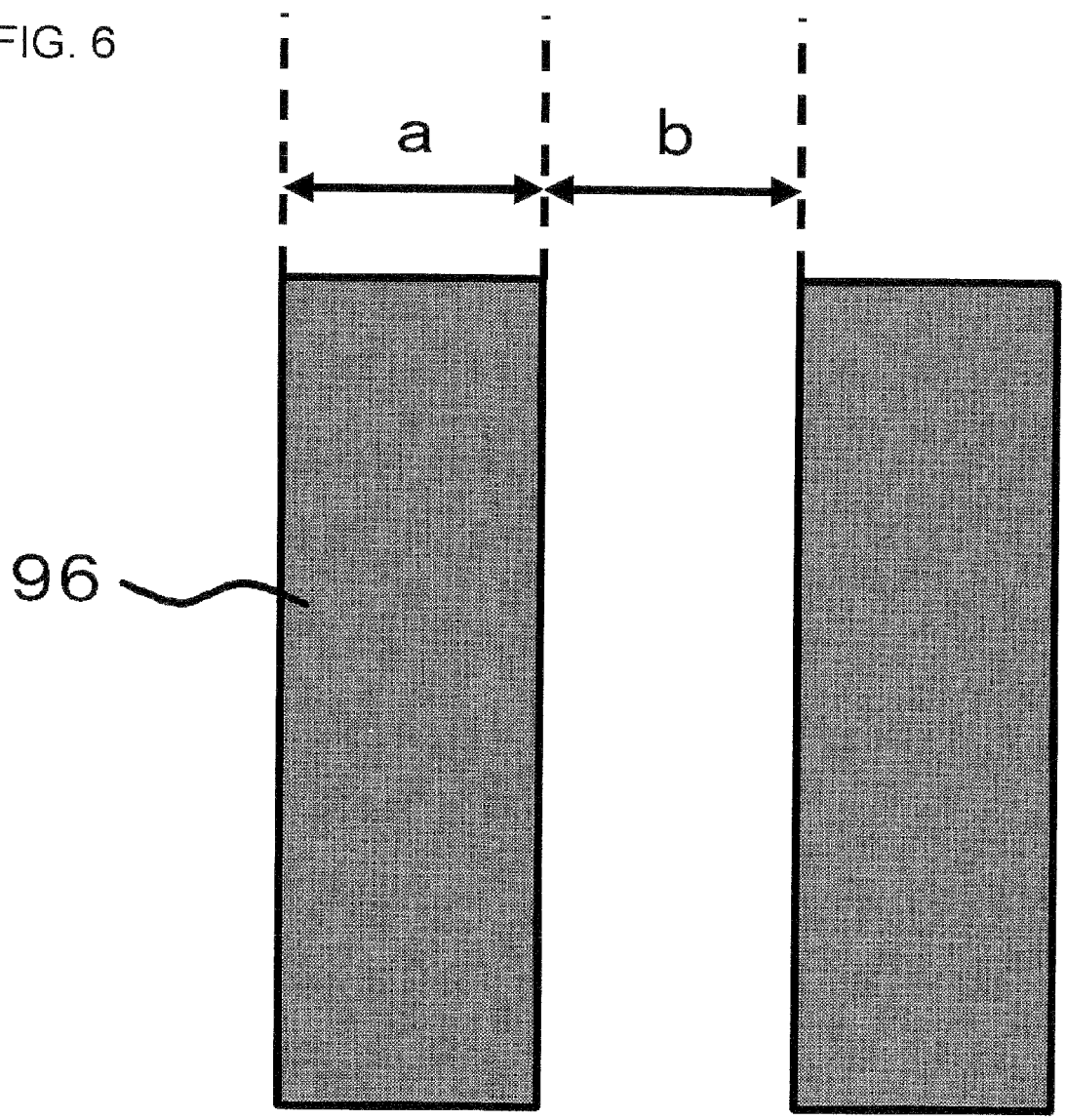
FIG. 6 is a plan view explaining the ratio of width and pitch of the interconnects.
Figure 7:
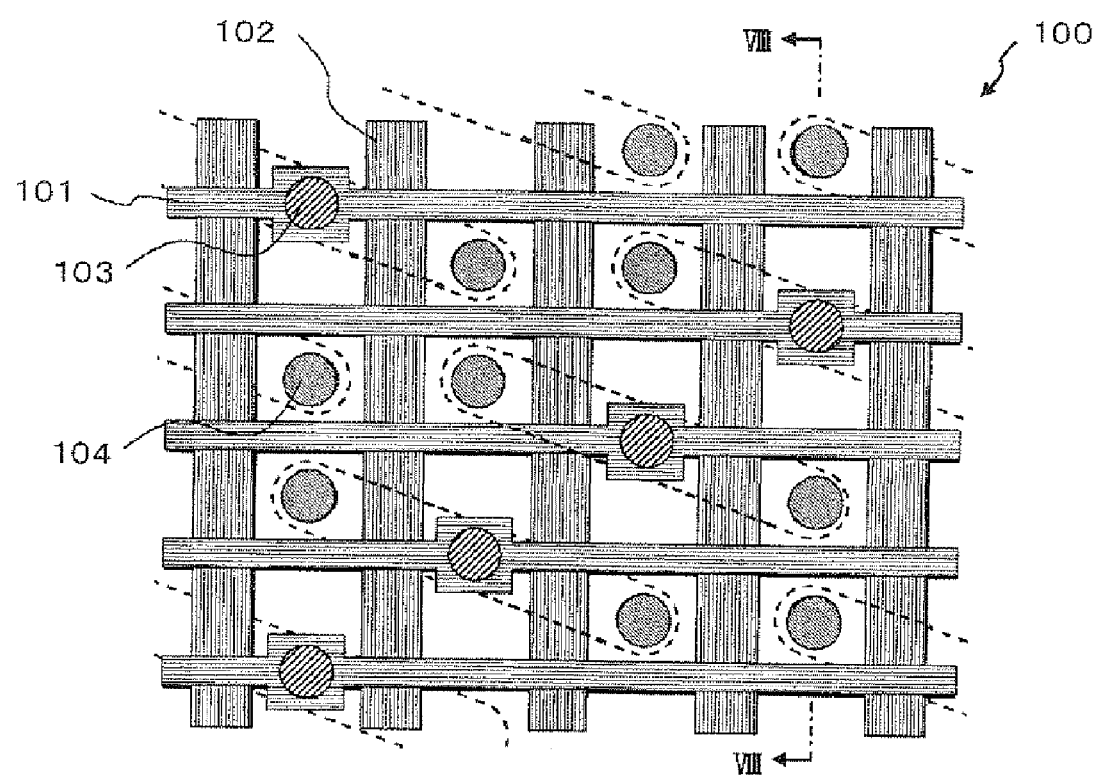
FIG. 7 is a plan view showing a conventional DRAM.
Figure 8:
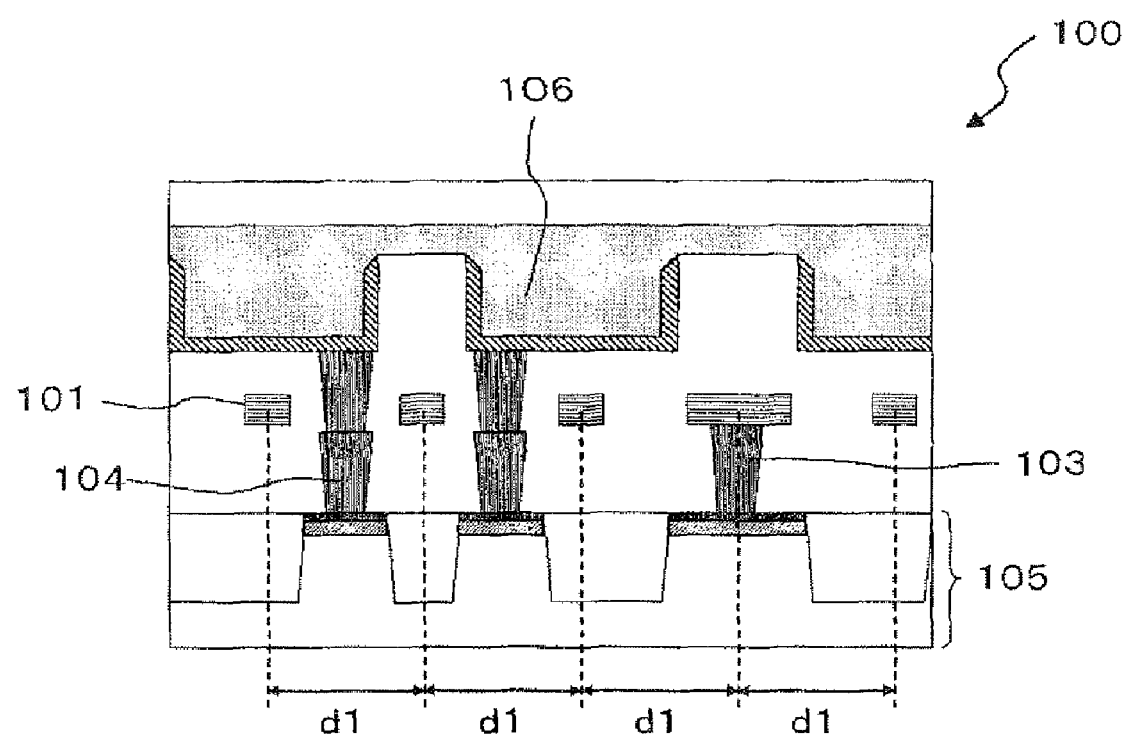
FIG. 8 is a sectional view taken along line VIII-VIII in FIG. 7.

This point will be explained referring to FIG. 5 and FIG. 6. FIG. 5 is a graph showing a relation between operation speed of circuit and ratio of width and distance of the interconnects. The ordinate represents the operation speed, and the abscissa represents the ratio of width and distance of the interconnects. The ratio of the width and distance of the interconnects is, as shown in FIG. 6, given by a/b assuming the width of each interconnect 96 as "a", and the distance between the interconnects 96 as b. As is taught by the graph, a target operation speed is achieved when a/b<1.0 holds. This condition corresponds to state where the distance d4 is larger than the width d5. Value of a/b is more preferably 0.8 or smaller, and still more preferably 0.6 or smaller.

The surficial portions of the source/drain region 72 and gate electrode 74 are silicided. Because the parasitic capacitance may be reduced by virtue of the silicidation, the FET 70 may be improved in the operation speed, and the DRAM may consequently be improved in the operation speed. In particular in this embodiment, the entire range of the surficial portions of the diffusion layers 56 and the entire range of the surficial portions of the word lines 60 in the DRAM are silicided. As a consequence, the operation speed of the DRAM may further be improved.

If the thickness of the bit lines 10 is 30 nm or larger and 90 nm or smaller, the parasitic capacitance may be suppressed to a sufficiently low level, and thereby the DRAM may be improved in the operation speed.

If a material composing the capacitor contacts 40 contains tungsten, the capacitor contacts 40 with lower resistivity may be realized. Also this contributes to improvement in the operation speed of DRAM.

The width of the bit lines 10 is kept nearly constant. By virtue of this configuration, also local resistivity of the bit lines 10 become nearly constant irrespective of positions. Being nearly constant in the width of the bit lines 10 is desirable also in view of arranging the bit lines 10 with higher density.

The DRAM in this embodiment is a embedded DRAM. The embedded DRAM is required so as to realize more faster read/write cycle as compared with general-purpose DRAM. Therefore, this embodiment, given with various efforts of improving the operation speed, may be notable for its striking effectiveness. According to this embodiment, an embedded DRAM provided with random access performance may be realized.

Figure 9:
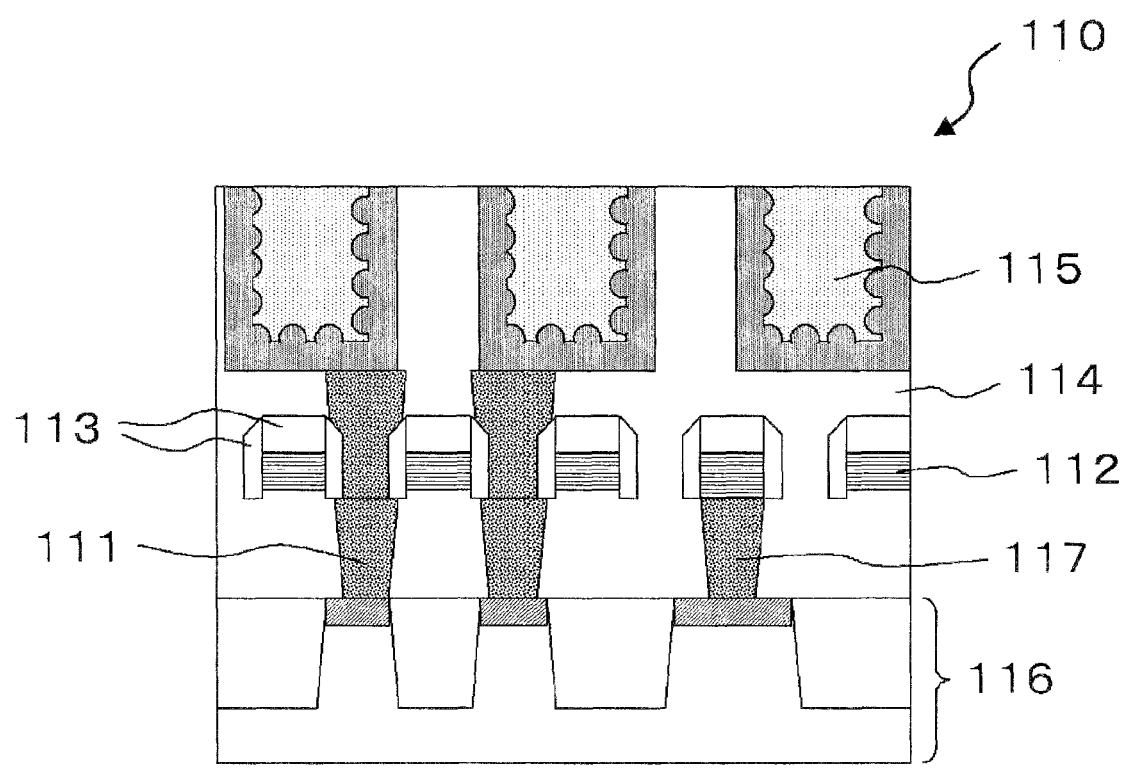
FIG. 9 is a sectional view showing an ordinary general-purpose DRAM.

For the embedded DRAM, there is a restriction in that high-temperature processes may not be adoptable in consideration of maintaining performance of FETs in the logic circuits. For an exemplary case of a general-purpose DRAM 110 shown in FIG. 9, capacitor contacts 111 are formed in a self-aligned manner. More specifically, openings are formed in an insulating interlayer 114 while using, as a mask, a SiN film 113 formed so as to cover bit lines 112, and the capacitor contacts 111 are formed so as to fill up the openings. The capacitor contacts 111 connect capacitors 115 and a semiconductor substrate 116. The bit lines 112 are connected to the semiconductor substrate 116 through the bit contacts 117.

According to the self-aligned process, the distance between the capacitor contacts 111 and the bit lines 112 may be minimized, and thereby the chip size may be reduced. However, any efforts of adopting the process to the embedded DRAM will raise the problem below. That is, process design for the embedded DRAM is dedicated to performances of FETs (which correspond to the FET 80 in this embodiment) of the logic circuit. In general, the source/drain regions and the gate electrode of FET is silicided. For an exemplary case where NiSi is used as the silicide, annealing at 500° C. or higher temperatures may induce phase transition of NiSi, and may elevate the resistivity (600° C. or higher temperatures may be necessary for formation of SiN film). Performances of the FET may consequently be degraded.

For this reason, it is difficult to adopt the self-aligned process to the embedded DRAM. Although there are some sort of nitride films formable at low temperatures, such nitride films cannot ensure a sufficient level of film quality required for the self-aligned process (that is, durability against etching sufficient for allowing it to function as a mask).

Accordingly, in the embedded DRAM, it is necessary to ensure a sufficient level of alignment margin between the bit lines and the capacitor contacts. The area of DRAM cells will inevitably expand as compared with the case where the self-aligned process is adopted. This consequently raises a problem of increase in the chip size, and decrease in the number of chips yielded from a single wafer. Increase in the chip size also raises a problem in that incidence of defects in a single chip may increase in a probabilistic manner, and may consequently lower the yield. According to this embodiment, these problems in the conventional embedded DRAM may be suppressed, because the bit lines may be arranged with higher density.

In this embodiment, both of the upper electrode 26 and the lower electrode 22 of the capacitors 20 are composed of a metal material. By virtue of this configuration, both electrodes may be formed under low temperatures. An exemplary case of forming the electrodes using polysilicon may result in degradation in performances of FETs as described in the above, because the film is necessarily be formed at high temperatures. In contrast, this embodiment allows formation of the electrodes of the capacitors 20 at lower temperatures, and thereby such problems may be avoidable.

Second Embodiment

Figure 10:
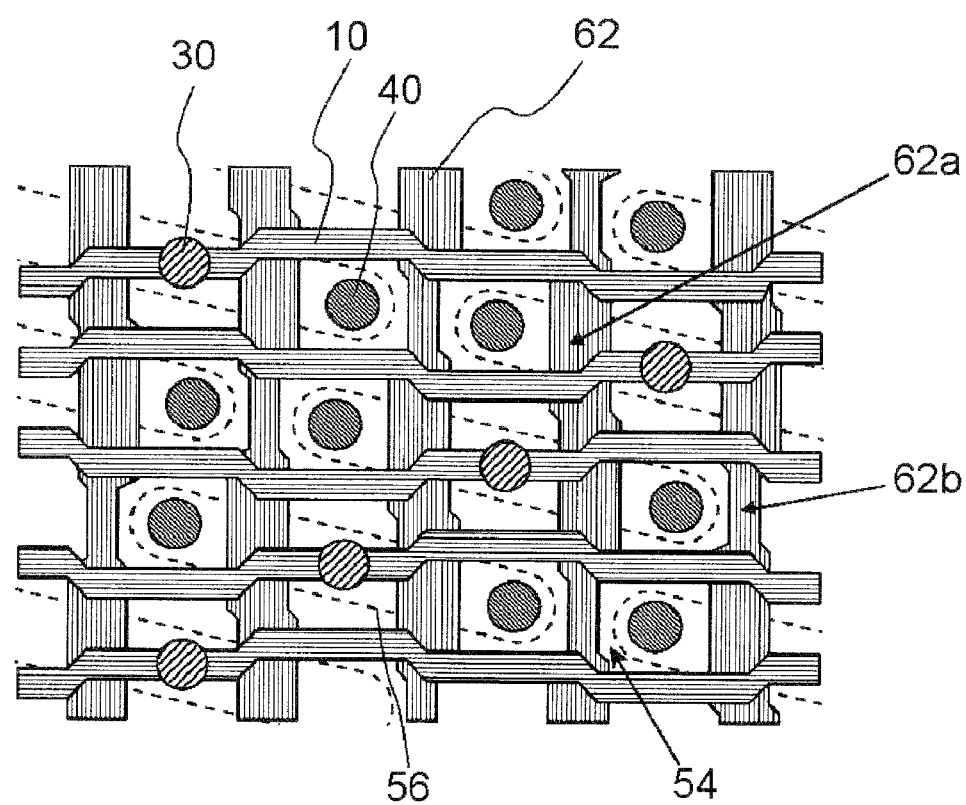
FIG. 10 is a plan view showing a second embodiment of the semiconductor memory device of the present invention.

According to the fore mentioned embodiment, it may decrease the chip size owing to higher in density of arrangement of the bit lines 10. In addition it may still decrease the chip size owing to higher in density of arrangement of the word lines 62. FIG. 10 is a plan view showing on embodiment of the semiconductor memory device of the second embodiment. The widths 62b of the word lines 62 on a device isolation region 54 which isolates between diffusion layers 56 are narrower than the widths 62a of the word lines on the source and drain diffusion layers 56. Use of this arrangement decreases the chip size owing to higher in density of arrangement of the word lines 62, while maintaining the characteristics of FETs. Because the word lines are formed with the gate electrode, narrowing widths of the word lines formed on the device isolation region does not influence the FET characteristics.

The present invention is by no means limited to the above-described embodiments, and instead allows various modifications. For example, the embodiments in the above showed the exemplary cases where the bit lines have nearly constant width, but the bit lines may not be constant. Alternatively, the DRAM exemplified as an embedded DRAM in the above-described embodiments may be a general DRAM. That is, the logic circuits may be omissible.

It is apparent that the present invention is not limited to the above embodiment, that may be modified and changed without departing from the scope and spirit of the invention.

What is claimed is:

1. A semiconductor memory device, comprising:
    a plurality of bit lines provided above a semiconductor substrate;
    capacitors provided in an upper layer of said bit lines;
    first field effect transistors connected to said capacitors;
    second field effect transistors having a gate length shorter than that of said first field effect transistors;
    bit contacts connecting said bit lines and said semiconductor substrate; and
    capacitor contacts connecting said capacitors and said semiconductor substrate,
    wherein in two adjacent bit lines, a first pitch representing a pitch of portions provided with said capacitor contacts is larger than a second pitch representing a pitch of portions provided with said bit contacts, and
    distance between two said bit lines in said portions provided with said bit contacts is larger than width of said bit lines in said portions provided with said bit contacts.

2. The semiconductor memory device as claimed in claim 1, wherein said first field effect transistors have a silicide layer on the surfaces of the gate electrodes and the source/drain regions.

3. The semiconductor memory device as claimed in claim 1, wherein said second field effect transistors have gate insulating films thinner than those of said first field effect transistors.

4. The semiconductor memory device as claimed in claim 1, wherein thickness of each of said bit lines is 30 nm or larger and 90 nm or smaller.

5. The semiconductor memory device as claimed in claim 1, wherein, assuming said second pitch as 1, said first pitch is 1.2 or larger and 2 or smaller.

6. The semiconductor memory device as claimed in claim 1, further comprising:

word lines extending in a first direction, and diffusion layers formed in said semiconductor substrate, and extending in a second direction, wherein angle θ between said first direction and said second direction satisfies 0<θ<90°.

7. The semiconductor memory device as claimed in claim 1, wherein a material composing said capacitor contacts contains tungsten.

8. The semiconductor memory device as claimed in claim 1, wherein both of the upper electrodes and the lower electrodes of said capacitors are composed of a metal material.

9. The semiconductor memory device as claimed in claim 1, wherein said capacitors compose DRAMs.

10. The semiconductor memory device as claimed in claim 9, wherein said DRAMs are mounted together with logic circuits.

11. A semiconductor memory device, comprising:

a plurality of bit lines provided above a semiconductor substrate;

capacitors provided in an upper layer of said bit lines;

bit contacts connecting said bit lines and said semiconductor substrate; and capacitor contacts connecting said capacitors and said semiconductor substrate, wherein in two adjacent bit lines, a first pitch representing a pitch of portions provided with said capacitor contacts is larger than a second pitch representing a pitch of portions provided with said bit contacts, and distance between two said bit lines in said portions provided with said bit contacts is larger than width of said bit lines in said portions provided with said bit contacts, and distance of two said bit lines in the portions provided with said bit contacts corresponds to the minimum distance between two said bit lines.

12. The semiconductor memory device as claimed in claim 11, wherein width of each of said bit lines is set nearly constant.

13. A semiconductor memory device, comprising:

a plurality of bit lines provided above a semiconductor substrate;

word lines extending on the semiconductor substrate, diffusion layers formed in said semiconductor substrate, and a device isolation region isolating between said diffusion layers;

capacitors provided in an upper layer of said bit lines;

bit contacts connecting said bit lines and said semiconductor substrate; and capacitor contacts connecting said capacitors and said semiconductor substrate, wherein in two adjacent bit lines, a first pitch representing a pitch of portions provided with said capacitor contacts is larger than a second pitch representing a pitch of portions provided with said bit contacts, and distance between two said bit lines in said portions provided with said bit contacts is larger than width of said bit lines in said portions provided with said bit contacts, wherein the widths of a part of word line are narrower than widths of the other part of word line.

14. The semiconductor memory device as claimed in claim 13, wherein widths of said part of word line is provided in said device isolation region.

* * * * *